(12) United States Patent
Raghuram et al.

(10) Patent No.: US 7,955,515 B2
(45) Date of Patent: Jun. 7, 2011

(54) METHOD OF PLASMA ETCHING TRANSITION METAL OXIDES

(75) Inventors: Usha Raghuram, San Jose, CA (US); Michael W. Konevecki, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 676 days.

(21) Appl. No.: 11/681,022

(22) Filed: Mar. 1, 2007

(65) Prior Publication Data

US 2007/0295690 A1 Dec. 27, 2007

Related U.S. Application Data

(63) Continuation-in-part of application No. 11/179,423, filed on Jul. 11, 2005, now abandoned.

(51) Int. Cl.
*C03C 15/00* (2006.01)
(52) U.S. Cl. ............... 216/67; 216/70; 216/75; 216/76
(58) Field of Classification Search .............. 216/67, 216/70, 75, 76
See application file for complete search history.

(56) References Cited

U.S. PATENT DOCUMENTS

| | | | |
|---|---|---|---|
| 4,659,426 A | 4/1987 | Fuller et al. | |
| 5,915,167 A | 6/1999 | Leedy | |
| 6,156,666 A | 12/2000 | Tokushima | |
| 6,225,202 B1 * | 5/2001 | Gupta et al. | 438/586 |
| 6,525,953 B1 | 2/2003 | Johnson | |
| 6,821,451 B2 | 11/2004 | Hattori | |
| 7,338,907 B2 * | 3/2008 | Li et al. | 438/724 |
| 2002/0155723 A1 | 10/2002 | Sasaki et al. | |
| 2003/0211748 A1 * | 11/2003 | Jin et al. | 438/709 |
| 2004/0014327 A1 * | 1/2004 | Ji et al. | 438/722 |
| 2004/0023452 A1 * | 2/2004 | Wang et al. | 438/202 |
| 2005/0121742 A1 | 6/2005 | Petti et al. | |
| 2005/0263487 A1 | 12/2005 | Tsuchiya | |
| 2006/0250836 A1 | 11/2006 | Herner et al. | |
| 2007/0010100 A1 | 1/2007 | Raghuram et al. | |

FOREIGN PATENT DOCUMENTS

| | | |
|---|---|---|
| EP | 0 285 129 A2 | 10/1988 |
| GB | 2 331 273 A | 5/1999 |
| JP | 2000 322710 A | 11/2000 |
| JP | 2000322710 A * | 11/2000 |
| TW | I233644 | 6/2005 |

OTHER PUBLICATIONS

Hsiao, Richard, "Fabrication of Magnetic Recording Heads and Dry Etching of Head Materials", 0018-8646/99 © 1999 IBM, www.research.ibm.com/journal/rd/431//hsiao.txt,(1999).

Greenwood, N.N. ,et al. "Chemistry of the Elements",(text book) Publisher: Butterworth-Heinemann; Second Edition, (Nov. 25, 1997),928;929;1146.

International Search Report of International Application No. PCT/US2006/026896 mailed Jan. 24, 2007.

Written Opinion of International Application No. PCT/US2006/026896 mailed Jan. 24, 2007.

(Continued)

*Primary Examiner* — Binh X Tran
(74) *Attorney, Agent, or Firm* — Dugan & Dugan, PC

(57) ABSTRACT

A method of plasma etching transition metal oxide thin films using carbon monoxide as the primary source gas. This permits carbonyl chemistries to be used at ambient temperature, without heating.

11 Claims, 3 Drawing Sheets

OTHER PUBLICATIONS

International Preliminary Report on Patentability of International Application No. PCT/US2006/026896 issued Jan. 16, 2008.
International Search Report and Written Opinion of International Application No. PCT/US08/02706 mailed Jun. 2, 2008.
International Preliminary Report on Patentability of International Application No. PCT/US2008/002706 issued Sep. 1, 2009.
Preliminary Amendment of U.S. Appl. No. 11/179,423 mailed Sep. 10, 2005.
Restriction Requirement of U.S. Appl. No. 11/179,423 mailed Nov. 1, 2006.
Notice of Abandonment of U.S. Appl. No. 11/179,423 mailed Jul. 5, 2007.
Office Action of Taiwan Application No. 95125311 mailed Mar. 25, 2010.
Search Report of Taiwan Application No. 95125311 mailed Feb. 23, 2010.
Office Action of Chinese Application No. 200880006814.9 issued Sep. 17, 2010.
Amendment filed in Japanese Patent Application No. 2009-551738 dated Jan. 31, 2011.
Apr. 2, 2011 Reply to Sep. 17, 2010 Office Action of related Chinese Application No. 200880006814.9.

* cited by examiner

METHOD OF PLASMA ETCHING TRANSITION METAL OXIDES

The present application is a continuation-in-part of U.S. patent application Ser. No. 11/179,423, filed Jul. 11, 2005 now abandoned, entitled "Method of Plasma Etching Transition Metals and Their Compounds", now abandoned, which is hereby incorporated by reference in its entirety.

BACKGROUND OF THE INVENTIONS

Typically transition metals and transition metal compounds are difficult to etch since most common etchants produce non-volatile byproducts which remain on the etched surface. Therefore it would be highly desirable to have a new and improved method of plasma etching transition metal compounds while simultaneously reducing defect levels significantly.

BRIEF SUMMARY OF THE INVENTIONS

A method of plasma etching comprises using a primary etchant of carbon monoxide gas to etch a transition metal oxide and form a volatile metal carbonyl by-product that can be efficiently removed during the plasma etch.

In various sample embodiments the carbon monoxide is diluted with an inert gas, such as argon.

In various sample embodiments the transition metal oxide is a thin film.

In various sample embodiments the transition metal oxide is part of an electronic device structure being fabricated on a semiconductor substrate.

In various embodiments a magnetic field is applied during etching.

Advantages and expected advantages of various disclosed embodiments include:

Carbonyl etch chemistry can be used without heating.
Cumulative time-at-temperature can be minimized.
Clean etching of transition metal oxides is achieved.

BRIEF DESCRIPTION OF THE DRAWINGS

The above mentioned features and steps of the invention and the manner of attaining them will become apparent, and the invention itself will be understood by reference to the following description of the preferred embodiment(s) of the invention in conjunction with the accompanying drawings wherein.

DETAILED DESCRIPTION OF THE PREFERRED EMBODIMENTS OF THE INVENTIONS

A method of plasma etching transition metals and transition metal compounds, including transition metal oxides, with carbon monoxide is disclosed. The following description is presented to enable any person skilled in the art to make and use the invention. For purposes of explanation, specific nomenclature is set forth to provide a thorough understanding of the present invention. Descriptions of specific applications and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

Figure 4:
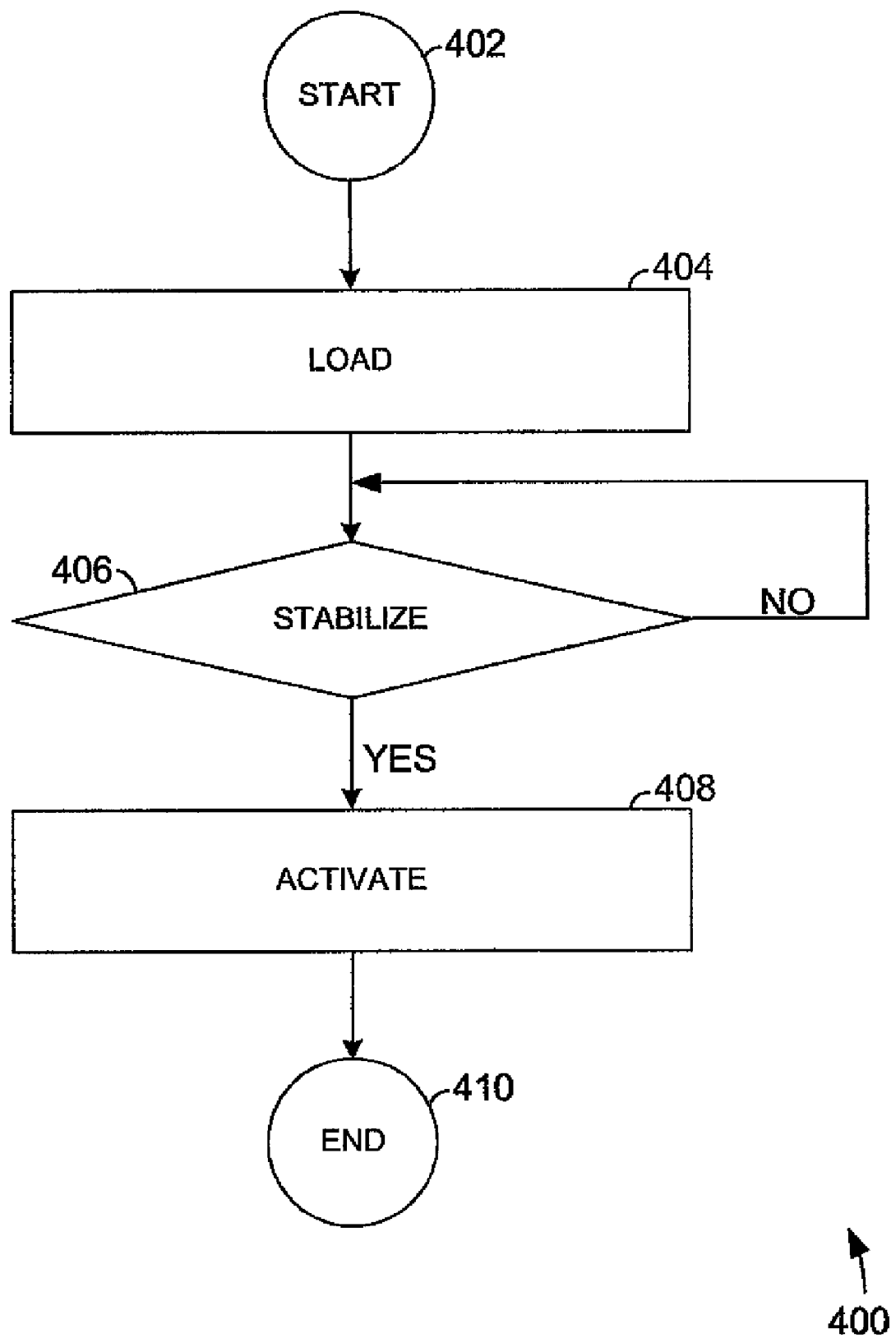
FIG. 4 is a flowchart of a processing method which is in accordance with a preferred embodiment of the present invention.

Referring now to the drawings and more particularly to FIG. 4 thereof, there is shown a flow chart of a plasma etching process 400 for etching a transition metal or transition metal compound, which method 400 is in accordance with a preferred embodiment of the present invention. The disclosed plasma etching method 400, as will be explained hereinafter in greater detail, results in a reaction between a primary etchant of carbon monoxide or carbon monoxide-based plasma and a transition metal or transition metal compound, which in turn, forms a volatile by-product of metal carbonyl, thereby promoting the quick and easy removal of metal carbonyl by-product by pumping it away from the plasma etcher as it is generated.

Before discussing the etching method 400 in greater detail, it may be beneficial to briefly review the current state of the art for etching transition metals and transition metal oxides, such as nickel oxide. To begin, it should be noted that there is very little information on plasma etching nickel oxide in the available literature. There are some references to wet etching and sputter etching in a plasma tool; however, none of the prior art specifically addresses plasma etching nickel oxide or other transition metals or transition metal compounds.

Notwithstanding the lack of literature, it is well known that nickel oxide as well as other transition metals and transition metal compounds are difficult to etch since most of the common etchants produce non-volatile by-products, such as nickel fluoride and nickel chloride in the case of nickel or nickel oxide in a fluorine or chlorine based plasma respectively. For example, with reference to etching nickel oxide, the prior art has required a high sputter component to etch, which leaves unwanted and undesired by-products as well as residues. Illustrative examples of excessive residue and poor etch profiles are depicted in the SEM photographs of FIGS. 1 and 2.

Figure 1:
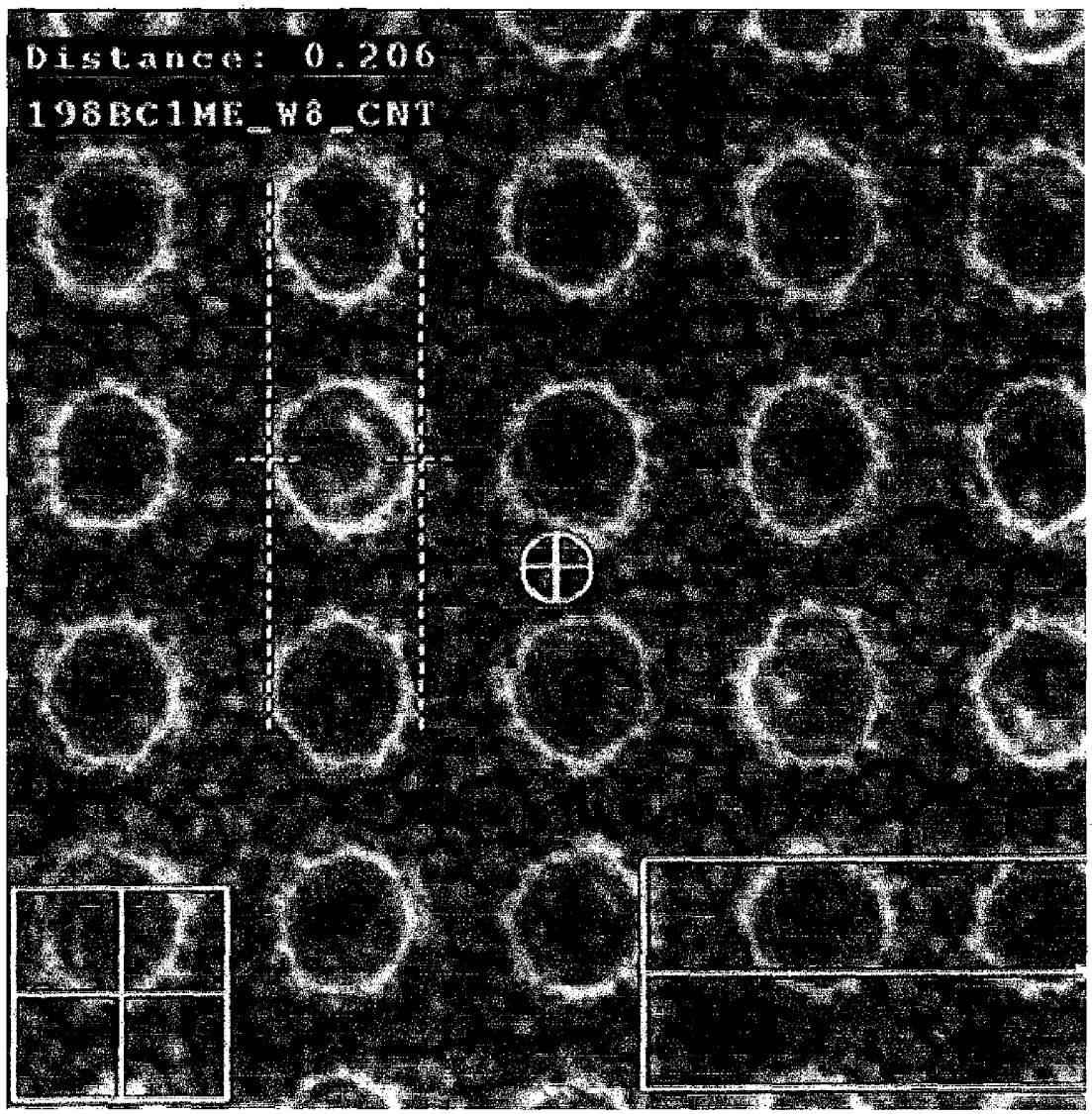
FIG. 1 is a scanning electron microscope (SEM) photograph of a top down view of a sputter etched nickel oxide structure showing excessive residue.
Figure 2:
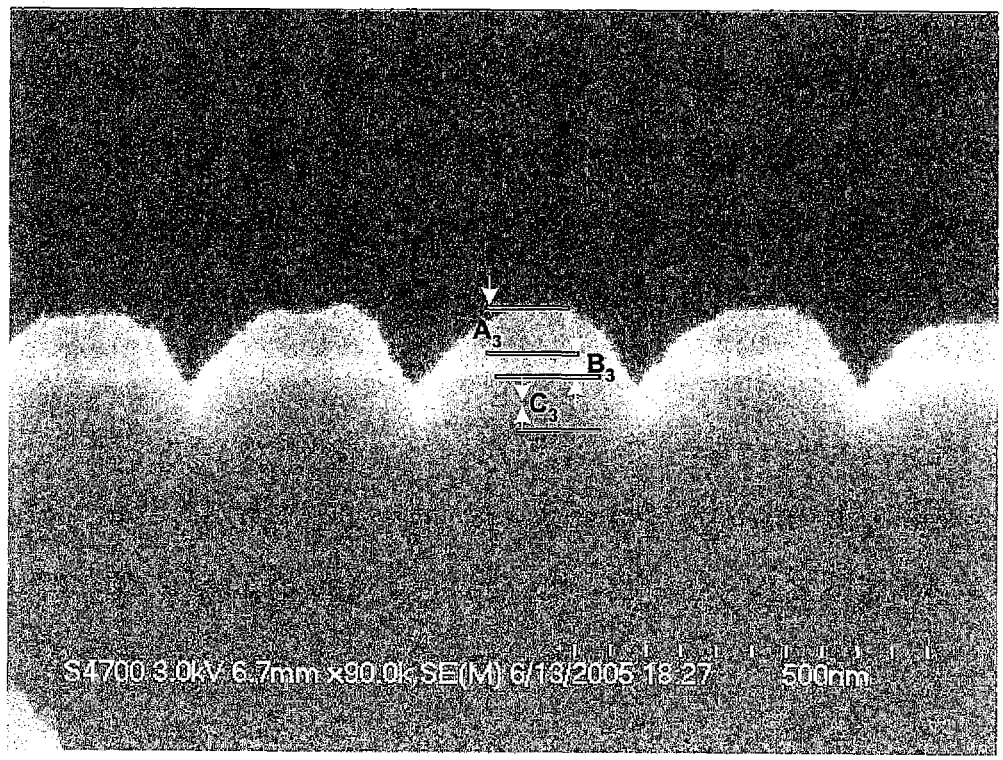
FIG. 2 is an SEM photograph of an undesirable etch profile associated with etching a sandwiched transition metal oxide stack using a sputter etch process.

More particularly, etching of nickel oxide using a conventional sputtering technique is shown in the SEM photograph of FIG. 1. In this regard, it can be seen that there is a considerable amount of unwanted and undesired residue formation which is disadvantageous when devices are produced in high volume. FIG. 2 is an SEM photograph showing a cross-section of an etched stack including a layer of nickel oxide between titanium nitride layers, showing a poor etch profile. These examples demonstrate that residues cannot be effectively removed and the resulting etch profile is sloped when the etch chemistry for the material being patterned produces nonvolatile by-products. In short then, such residues and sloped pattern profiles will lead to low and unpredictable yields particularly with circuitry incorporating these structures.

Other processes, such as screen printing and photo emulsion, have been utilized in the prior art to pattern similar transition metals and their various compounds. However, these processes do not scale well to the very small dimensions of modern integrated circuits or mix conveniently with existing, readily available semiconductor processes.

Considering now the plasma etching process 400 in greater detail with reference to FIG. 4, the process begins in a plasma etcher (not shown) at a start step 402. In this regard, a chamber within the plasma etcher is leaded at a loading step 404 with one or more wafers or some other appropriate substrate having at least a layer thereon of a transition metal or a transition metal compound to be patterned.

A layer of a transition metal or transition metal compound deposited over the wafer or other suitable substrate can be patterned and etched using methods of the present invention. Any suitable transition metal can be used, including nickel, iron, cobalt, tungsten, molybdenum, manganese, and ruthenium. Similarly, transition metal compounds can be patterned and etched, including oxides, nitrides, and silicides of suitable transition metals.

After the plasma chamber is loaded with the wafers at step 404, the process advances to stabilizing step 406, where the chamber is sealed and set to a relative low pressure to facilitate plasma etching. During the stabilizing step, which extends over a predetermined period of time, the gas sources connected to the chamber are allowed to flow into the chamber and to be pumped out and to stabilize at a given pressure set point. As will be explained hereinafter in greater detail, the gas sources allowed to flow into the chamber are a matter of choice depending upon the primary etchant desired and any additives that may be required.

After the chamber has stabilized, with the chamber pumps running, and the primary etchant gas and any desired additives flowing at a stabilized pressure, an RF power source is activated at an activation step 408 to strike the plasma to etch the wafers. The plasma is a carbon monoxide plasma, comprising carbon monoxide and any additives. At this point simultaneous on-going events occur within the chamber: 1) a plasma etch is in process relative to the wafers, 2) a volatile by-product is generated due to a chemical reaction between the gases flowing into the chamber and the material being etched, and 3) volatile by-products of the etch process are evacuated from the chamber as they are generated. These simultaneous events continue for a sufficient period of time to complete the desired etch of the transition metal or transition metal compound. When the desired etch is accomplished, the process goes to an end step 410.

It will be understood by those skilled in the art that some of the by-product may well be deposited on the wafers within the chamber as well as the chamber walls which may be potential sources of residue. The majority of the volatile by-product is however pumped out of the chamber.

Considering now the gas flow into the chamber in greater detail, a primary etchant of carbon monoxide gas, hereinafter simply called CO, is chosen for its specific reaction with transition metals and transition metal compounds. That is, a primary benefit of using CO as a primary etchant is that it reacts with most transition metals and transition metal compounds to form metal carbonyls that are volatile or that have relatively low boiling points. This is an important aspect of the present invention because the volatile by-product can be easily and quickly removed during etch which, in turn, results in significantly lower defect levels.

Sometimes gases, such as passivant gases that produce by-products that stick to the chamber walls or to the side walls of the wafer(s) being etched are deliberately added and are an integral part of the gas flow into the chamber. The addition of such passivant gases is done either to control the etch profile on the individual wafers and/or to maintain a particular chamber condition. Particular passivant gases that facilitate this process will be described hereinafter in greater detail.

While etching, it is necessary to ensure that the surface that is being etched stays free of residue while a passivating by-product sticks to the etched sidewalls. Ion assistance helps in ensuring that any passivating by-product does not stay on the surface being etched. Such ion assistance may be provided by added gases. This is important because if the passivating by-product stays on the surface being etched, it may cause the etch to stop or to be incomplete. In any event, by-products that stick to the sidewalls are removed in a subsequent conventional cleaning process that will not be described hereinafter in greater detail.

Considering the plasma etching process 400 in still greater detail, once the plasma etcher is stabilized and activated, the primary etchant, which is carbon monoxide (CO) plasma and any required additives, facilitate the plasma etch of the wafers disposed within the chamber. The term carbon monoxide based plasma will refer to a plasma which is largely carbon monoxide but which may include other additives. As the etching process is progressing, the CO reacts with the material to be etched (whether it be a transition metal or a transition metal compound, including oxides, nitrides and silicides) yielding a metal cabonyl by-product which is immediately evacuated from the chamber as quickly as it is formed. From the foregoing, it should be understood that this process allows the metal carbonyl by-product, which is a gaseous by-product, to be easily withdrawn from the etcher.

Additives that bay be flowing with the CO can include either individually or in any combination such additives as reducing agents like $H_2$ and dydrofluorocarbons, passivants like $N_2$ and fluorocarbons, and additives that provide ion assistance, such as argon and $BCl_3$.

Although the volatile metal carbonyl by-product has been described as a gas, it will be understood by those skilled in the art that the metal carbonyl by-product may also be a liquid. There is no intention of limiting the preferred embodiment to a gaseous type of metal carbonyl as a liquid type of metal carbonyl is also contemplated. In either case however, the metal carbonyl by-product may be easily and conveniently removed from the plasma etcher by a pumping action during etch.

Figure 3:
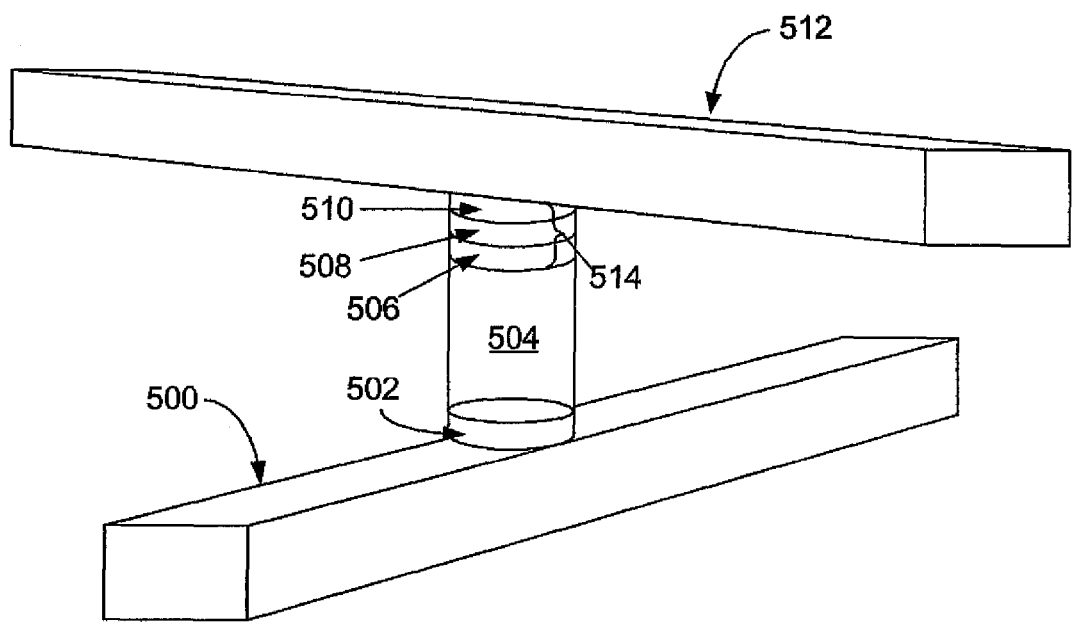
FIG. 3 is diagrammatic illustration of a portion of an integrated circuit with a sandwiched transition metal oxide stack similar to that shown in the photograph of FIG. 2.

Referring now to FIG. 3 a specific example will be provided to illustrate how the plasma etch process 400 can be applied to specific types of applications. As a first example, a process for forming a nonvolatile memory cell will be described in greater detail.

The process for forming a nonvolatile memory cell begins by providing layers to be etched above a wafer surface. Referring to FIG. 3, the structure to be formed includes a bottom conductor 500, a barrier layer 502, a vertically oriented semiconductor junction diode 504, a compound stack 514, and a top conductor 512. The compound stack 514 includes titanium nitride layer 506, nickel oxide layer 508, and titanium nitride layer 510. The word stack is utilized in this specification to mean an operative layer of material which may or may not be associated with other layers of operative materials that may be disposed below or above, or below and above, the first mentioned material layer. The layers in such a stack may be conducting or insulating.

It will be understood that in a conventional process, the structure shown in FIG. 3 is one of a large array of such structures formed at the same time on a single wafer. Only one such structure is shown form simplicity.

At the time the etch according to an embodiment of the present invention is to be performed, bottom conductor 500, barrier layer 502, and junction diode 504 have already been formed by conventional deposition and pattern and etch processes. These structures are surrounding by dielectric fill (not shown) which has been planarized, forming a top planar surface.

The layers of the compound stack 514 (titanium nitride layer 506, nickel oxide layer 508, and titanium nitride layer 510) have been deposited, and are to be patterned and etched to form the structure shown in FIG. 3 (Top conductor 512 will be formed in later conventional processes which will not be described herein.) FIG. 3 shows the compound stack 514 in perfect alignment with the underlying diode 504. In reality there may be some misalignment.

Next a photolithographic step will be performed. A layer of photoresist (not shown) is spun on top of top titanium nitride layer 510. Using a photomask in a conventional process, some areas of the photoresist are exposed, while others are not. A developing process removes the photoresist that has been exposed, while leaving behind the photoresist that was not exposed. In this way a pattern is transferred from a photomask to the photoresist. The etch step of the present invention will transfer the pattern from the photoresist above the compound stack to the underlying layers of the compound stack. As will be appreciated by those skilled in the art, additional layers, such as a hard mask, may exist. For example, the pattern may be transferred from the photoresist to the hard mask, then from the hard mask to the compound stack.

The wafer including compound stack 514 is then loaded into a plasma etcher at the load stop 404 to allow the plasma etch.

Once the plasma chamber has been loaded (step 404), stabilized (step 406), and activated (step 408), the activate or etch/evacuate process (step 408) begins. In this illustrative example, the etch/evacuate process is performed in two parts as will be explained hereinafter in greater detail.

In the present application example, the stack 514 (FIG. 3) of titanium nitride on bottom, nickel oxide in the middle, and titanium nitride on top needs to be patterned as a post/pillar on top of junction diode 504. U.S. patent application Ser. No. 11/125,939, entitled "Rewritable Memory Cell Comprising a Diode and Resistance-Switching Material", by S. Brad Herner and Christopher J. Petti, hereby incorporated by reference, describes a rewriteable memory cell like the structure of FIG. 3, comprising a vertically oriented polycrystalline semiconductor diode arranged in series with nickel oxide layer, wherein the nickel layer can be switched between resistivity states. The nickel oxide layer is between barrier layers or electrode layers, for example, as in the structure of FIG. 3, of titanium nitride. The stack to be etched, then, includes, from the top, a titanium nitride layer (or other suitable electrode), a nickel oxide layer, and a second titanium nitride layer. This etch can be performed using embodiments of the present invention. For completeness, it should be understood that in some alternative embodiments, the TiN—NiO—TiN stack is deposited before the polycrystalline diode 504 has been etched, and all of these layers are etched in a single pattern and etch step.

Considering now the activate step 408 in still greater detail, in the activate step a carbon monoxide based chemistry is used to plasma etch the nickel oxide in the stack 310, and thus, produces a volatile by-product of nickel carbonyl. The foregoing chemical reaction is expressed by Equation 1:

$$NiO + 5CO \rightarrow Ni(CO)_4 + CO_2 \qquad \text{Equation (1)}$$

More generally, this may be expressed in Equations 2 and 3 as follows:

$$TM + xCO \rightarrow TM(CO)_x \qquad \text{Equation (2)}$$

where TM means transition metal.

$$TMOy + (x+y)CO \rightarrow TM(CO)_x + yCO_2 \qquad \text{Equation (3)}.$$

If argon is utilized as an additive to the CO, it will provide ion assistance during the plasma etch process. Similarly, if needed, other passivants such as $N_2$ may be added to the CO plasma to assist in etching and profile control. The top and bottom titanium nitride layers can be etched using conventional fluorine-base chemistry. These can be done as part of the NiO etching in separate sub-steps performed before and after the NiO etch.

If a reducing action is required, then other reactive gases such as $CH_3F$, $CH_2F_2$ or $H_2$ may be employed.

As an alternative to the oxide etcher, a metal or poly etcher may be used if CO is made available. In this case a $Cl_2/BCl_3$ based chemistry or a $Cl_2/HBr$ chemistry is used to etch the titanium nitride.

The etch of the structure 514 occurs in three steps. First, an oxide etcher is used to provide a fluorine plasma to etch titanium nitride layer 508 within the stack 514, and then to provide the carbon monoxide plasma to etch nickel oxide layer 508 in the stack 514. Finally the etch chemistry is changed back to a fluorine-based chemistry to etch titanium nitride layer 506. The areas of the wafer surface that are not protected by photoresist are etched during this etch step, while the protected areas remain. In this way the structure shown in FIG. 3 is formed. As described earlier, the by-product resulting from the CO gas etch is immediately evacuated as fast as it is formed during the etch.

As the carbon monoxide plasma reacts with the nickel oxide, a volatile nickel carbonyl by-product is formed, which is evacuated as it is formed. From the foregoing, it will be understood that since the by-product is a gas, it can quickly and easily be exhausted from the plasma etcher leaving a cleanly etched end product. The process stops at an end stop 410 when the etch is completed.

It should be understood that the fluorine etching steps only became necessary since the nickel oxide was sandwiched between a layer of top and bottom titanium nitride. In short, if TiN layers are present in the stack structure of 514, the corresponding fluorine etching steps are not necessary.

Considering the process of using a carbon monoxide plasma for etching a transition metal such as nickel oxide in greater detail, it should be understood by those skilled in the art that using carbon monoxide as an etchant is not limited to etching only nickel and nickel oxide as noted earlier. That is, the process can be applied equally well to other transition metals and other transition metal compounds, such as iron and oxides of iron, for example. In this regard, the same methodology can be utilized to etch other transition metals, their oxides or other associated compounds. In short, one of the key benefits of using carbon monoxide as an etchant is that it reacts with most transition metals to form metal carbonyls that are volatile or that have relatively low boiling points. This, in turn results in significantly lower defect levels. This is an important aspect of the present invention.

Another important aspect of the present invention is that carbon monoxide can also act as a reducing agent and hence transition metal oxides can also be etched in a carbon monoxide containing plasma. It should also be understood by those skilled in the art that other gases may be required and used in a plasma etcher. For example, $Ar/BCl_3$ may provide energetic ion bombardment; hydrogenated fluorocarbons or $H_2$ may be useful in providing a reducing ambient, if needed.

In an example application of using carbon monoxide plasma as a primary etchant, a process has been described relative to a stack of titanium nitride, nickel oxide, titanium nitride. Other examples would include forming a vertically oriented semiconductor junction diode with a transition metal or transition metal oxide above or below the semiconductor junction diode and then plasma etching the structure above or below the semiconductor junction diode with carbon monoxide-based plasma.

As is described further in Herner et al., when a plurality of structures like those shown in FIG. 3 has been formed above a substrate (for example above a monocrystalline silicon wafer), a first memory level has been formed. Additional memory levels can be formed above the first one, forming a monolithic three dimensional memory array. Each nonvolatile memory cell resides in the monolithic three dimensional memory array.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

From the foregoing, it should be understood that the use of a sandwiched structure is for providing an example of the application of carbon monoxide plasma as a primary etchant only. In this regard, it is contemplated that the method of using carbon monoxide as an etchant can be applied to may other types of transition metals, their oxides and compounds of transition metal oxides.

EXAMPLE 1

A blanket plasma etching experiment was conducted in a standard oxide etcher. A flow of predominantly carbon monoxide (as specified below) was supplied.

The test sample was a wafer having an un-patterned nickel oxide ("NiO") layer that was sputtered onto TiN over an $SiO_2$ base. Plasma etching was conducted under the following conditions:

(i) 45 second etch
(ii) 1000 W RF power
(iii) 40 millitorr operating pressure
(iv) 100 standard cubic centimeters per minute (sccm) of CO
(v) 200 sccm of Argon
(vi) 30G B-field
(vii) The wafer was cooled to 15 degrees Celsius.
(viii) Backside cooling Helium pressure of 16 torr With these conditions, an etch of about 230 Angstrom ("Å") was achieved. The range in etch across the wafer was about 10 Å. Note that the etch is the average NiO loss between the center and the edge of the wafer as determined by a cross-section measurement.

EXAMPLE 2

Another etching experiment was run using the same apparatus as used in Example 1. The experiment was conducted on a TiN/NiO/TiN stack with photo resist masking. A first etch was conducted using $CF_4/CHF_3$ to etch the top TiN layer. A second etch was conducted using carbon monoxide to etch the NiO layer. For the second etch, the process conditions were the same as that used for Example 1, except that three different power/etching time combinations were used. The following measured data was obtained:

(i) 1000 W for 45 seconds resulted in about a 240 Å NiO loss
(ii) 1000 W for 90 seconds resulted in about a 285 Å NiO loss
(iii) 1500 W for 45 seconds resulted in about a 330 Å NiO loss.

Modifications and Variations

As will be recognized by those skilled in the art, the innovative concepts described in the present application can be modified and varied over a range of applications, and accordingly the scope of patented subject matter is not limited by any of the specific exemplary teachings given. It is intended to embrace all such alternatives, modifications, and variations that fall within the spirit and broad scope of the appended claims.

The methods of the present application can operate across a wide range of plasma etching conditions. In various contemplated embodiments these ranges can include, for example:

| | | |
|---|---|---|
| (i) | Time range of: | 10 to 100 seconds |
| (ii) | RF power of: | 800 to 2000 W |
| (iii) | Operating pressure of: | 30 to 200 millitorr |
| (iv) | CO flow rate of: | 50 to 250 sccm |
| (v) | Argon flow rate of: | 100 to 500 sccm |
| (vi) | Wafer temperature of: | 15 to 60 deg C. |
| (vii) | Backside cooling He: | 8 to 20 torr |

As will be appreciated by those of ordinary skill, these ranges can be exploited singly or in various combinations. Moreover, these ranges are merely illustrative, and values outside these ranges can optionally be used in various less preferred embodiments.

One of ordinary skill in the art, with the benefit of this disclosure, will recognize the appropriate use of the methods for a chose application of a given or dynamic set of operating parameters.

Optionally, the operating conditions of the methods of the present application can be adjusted in various combinations. The selected combination depends partially on the desired etching results and the operational envelope of the plasma processing system being utilized.

For example, one variation of Example 1 process conditions which is predicted to achieve satisfactory etching results is:

(i) increase the power from 1000 W to 1300 W;
(ii) increase the operating pressure from 40 millitorr to 44 millitorr;
(iii) increase backside helium pressure from 16 torr to 18 torr;
(iv) increase the CO flow from 100 sccm to 110 sccm; and
(v) keep all other conditions constant.

Another variation of Example 1 which is predicted to achieve satisfactory etching results is:
(i) increase power from 1000 W to 1500 W;
(ii) decrease etching time from 90 seconds to 60 seconds; and
(iii) keep all other conditions constant.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle. The claims as filed are intended to be as comprehensive as possible, and NO subject matter is intentionally relinquished, dedicated, or abandoned.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle. The claims as filed are intended to be as comprehensive as possible, and NO subject matter is intentionally relinquished, dedicated, or abandoned.

We claim:

1. A method of etching, comprising carbon monoxide-based plasma etching of a transition metal oxide at a temperature of 60 degrees Celsius or less, wherein said plasma etching is performed using a source gas which consists essentially of carbon monoxide.

2. The method of claim 1, wherein said transition metal oxide is selected from the group consisting of: nickel oxide, iron oxide, and cobalt oxide.

3. The method of claim 1, wherein said plasma etching is performed using an applied magnetic field.

4. A method of etching, comprising carbon monoxide-based plasma etching of a transition metal oxide at a temperature of 60 degrees Celsius or less, wherein said plasma etching is performed using a source gas which consists only of carbon monoxide plus an inert diluent.

5. A method of forming a memory cell, the method comprising:
plasma etching a cooled thin film of a transition metal oxide using a carbon monoxide-based source gas at a temperature of 60 degrees Celsius or less, wherein said source gas which consists essentially of carbon monoxide.

6. The method of claim 5, wherein said transition metal oxide is selected from the group consisting of: nickel oxide, iron oxide, and cobalt oxide.

7. The method of claim 5, wherein said plasma etching is performed using an applied magnetic field.

8. A method of forming a memory cell, the method comprising:
plasma etching a cooled thin film of a transition metal oxide using a carbon monoxide-based source gas at a temperature of 60 degrees Celsius or less, wherein said source gas which consists only of carbon monoxide plus an inert diluent.

9. A method of etching a thin film of nickel oxide, comprising:
flowing a source gas which consists essentially of carbon monoxide;
generating a glow discharge in proximity to the thin film, to thereby induce plasma bombardment;
cooling said thin film to 60 degrees Celsius or less; and
exhausting gases.

10. The method of claim 9, wherein said thin film of nickel oxide is stacked with at least one conducting material.

11. The method of claim 9, wherein said nickel oxide layer is stacked with at least one insulating material.

* * * * *